(12) United States Patent
Glodde et al.

(10) Patent No.: US 10,964,541 B2
(45) Date of Patent: *Mar. 30, 2021

(54) METHOD TO IMPROVE ADHESION OF PHOTORESIST ON SILICON SUBSTRATE FOR EXTREME ULTRAVIOLET AND ELECTRON BEAM LITHOGRAPHY

(71) Applicant: INTERNATIONAL BUSINESS MACHINES CORPORATION, Armonk, NY (US)

(72) Inventors: Martin Glodde, Pine Brook, NJ (US); Dario L. Goldfarb, Dobbs Ferry, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/688,179

(22) Filed: Nov. 19, 2019

(65) Prior Publication Data
US 2020/0090936 A1 Mar. 19, 2020

Related U.S. Application Data

(63) Continuation of application No. 16/050,685, filed on Jul. 31, 2018, now Pat. No. 10,553,432, which is a (Continued)

(51) Int. Cl.
*H01L 21/033* (2006.01)
*H01L 21/027* (2006.01)
(Continued)

(52) U.S. Cl.
CPC ........ *H01L 21/0338* (2013.01); *G03F 7/0751* (2013.01); *G03F 7/16* (2013.01);
(Continued)

(58) Field of Classification Search
None
See application file for complete search history.

(56) References Cited

U.S. PATENT DOCUMENTS 3,549,368 A 12/1970 Collins et al.
4,603,168 A 7/1986 Sasaki et al.
(Continued)

FOREIGN PATENT DOCUMENTS

TW 201608335 A 3/2016

OTHER PUBLICATIONS

R. Leuschner and G. Pawlowski, "Photolithography", in Handbook of Semiconductor Technology, vol. 2, Published by Wiley-VCH, Weiheim, pp. 182-183. (Year: 2000).*
(Continued)

*Primary Examiner* — Jiong-Ping Lu
(74) *Attorney, Agent, or Firm* — Tutunjian & Bitetto, P.C.; Abdy Raissinia

(57) ABSTRACT

An etch process that includes removing an oxide containing surface layer from a semiconductor surface to be etched by applying a hydrofluoric (HF) based chemistry, wherein the hydrofluoric (HF) based chemistry terminates the semiconductor surface to be etched with silicon-hydrogen bonds, and applying a vapor priming agent bearing chemical functionality based on the group consisting of alkynes, alcohols and a combination thereof to convert the silane terminated surface to a hydrophobic organic surface. The method continues with forming a photoresist layer on the hydrophobic organic surface; and patterning the photoresist layer. Thereafter, the patterned portions of the photoresist are developed to provide an etch mask. The portions of the semiconductor surface exposed by the etch mask are then etched.

20 Claims, 8 Drawing Sheets

Related U.S. Application Data continuation of application No. 15/433,619, filed on Feb. 15, 2017, now Pat. No. 10,096,477.

(51) Int. Cl.
    *G03F 7/075*     (2006.01)
    *G03F 7/16*     (2006.01)
    *G03F 7/20*     (2006.01)

(52) U.S. Cl.
    CPC ...... *G03F 7/70016* (2013.01); *G03F 7/70033* (2013.01); *H01L 21/0274* (2013.01); *H01L 21/0332* (2013.01); *H01L 21/0335* (2013.01); *H01L 21/0337* (2013.01)

(56) References Cited

U.S. PATENT DOCUMENTS

| | | | |
|---|---|---|---|
| 5,641,541 A * | 6/1997 | Chen | B05D 1/60 427/255.6 |
| 5,702,767 A * | 12/1997 | Peterson | H01L 21/312 427/407.1 |
| 7,459,261 B2 | 12/2008 | Hatakeyama et al. | |
| 8,343,694 B2 | 1/2013 | Koitabashi et al. | |
| 10,096,477 B2 * | 10/2018 | Glodde | H01L 21/0335 |
| 10,312,087 B2 * | 6/2019 | Glodde | H01L 21/0332 |
| 10,553,432 B2 * | 2/2020 | Glodde | H01L 21/0337 |
| 2004/0029396 A1 | 2/2004 | Zhang et al. | |
| 2012/0231974 A1 * | 9/2012 | Kim | C40B 50/14 506/16 |
| 2015/0072290 A1 | 3/2015 | Prokopowicz et al. | |

OTHER PUBLICATIONS

Foucaud, M. et al., "Surface preparations impact on 248nm deep UV photo resists adhesion during a wet etch" Solid State Phenomena (Dec. 2012) pp. 58-61, vol. 195.

U.S. Office Action issued in U.S. Appl. No. 15/804,568 dated Aug. 1, 2018, 8 pages.

List of IBM Patents or Patent Applications Treated as Related dated Nov. 19, 2019, 2 pages.

* cited by examiner

METHOD TO IMPROVE ADHESION OF PHOTORESIST ON SILICON SUBSTRATE FOR EXTREME ULTRAVIOLET AND ELECTRON BEAM LITHOGRAPHY

BACKGROUND

Technical Field

The present invention generally relates to lithographic materials for extreme ultraviolet (EUV) and electron beam (E-beam) lithography, and more particularly to inorganic hardmask processing used in EUV lithography.

Description of the Related Art

Semiconductor fabrication typically involves transfer of a pattern from a mask to a resist using lithography, and transfer of the pattern from the resist to a hardmask through etching. The pattern can then be transferred from the hardmask to a semiconductor material through further etching processes. In general, photolithography (in contrast to e-beam lithography, for example) uses light to form an image of the mask on a photoresist material, where the incident light can cause a photo reaction. Light for photolithography has progressed from wavelengths in the range of 436 nm (blue light) to 365 nm (near ultraviolet (UV)) to 248 nm (deep UV) to a wavelength of 193 nm. The wavelength of light has moved to smaller and smaller wavelengths in part because the smallest feature size that can be printed is determined in part by the wavelength, $\lambda$, of the light used. Another factor that can affect the smallest printed feature size is the numerical aperture, NA, of the projection optics. The depth-of-focus (DOF) is also determined by A and the numerical aperture NA, which is also typically a factor in resolving small features. The DOF can relate to a visible change in the image related to exposure dose, line width, sidewall angle, and resist loss. As feature sizes decrease, their sensitivity to focus errors increases.

In extreme ultraviolet lithography (EUVL) the extreme ultraviolet light (which also may be referred to as soft x-ray) has wavelengths from 124 nm down to 10 nm, and in particular for intended semiconductor processing, about 13.5 nm, as generated by a laser-pulsed tin (Sn) plasma source. The 13.5 nm EUV light is currently the focus of the next generation of photolithography tools and processes.

Electron-beam lithography (often abbreviated as e-beam lithography) is the practice of scanning a focused beam of electrons to draw custom shapes on a surface covered with an electron-sensitive film called a resist (exposing). The electron beam changes the solubility of the resist, enabling selective removal of either the exposed or non-exposed regions of the resist by immersing it in a solvent (developing). One advantage of electron-beam lithography is that in some examples it can draw custom patterns (direct-write) with sub-10 nm resolution.

High resolution patterning using Extreme Ultraviolet (EUV) lithography is typically carried out with a combination of dark field masks and EUV resists utilizing positive tone development (PTD). Among the different families of positive tone EUV resists, chemically amplified resists is a common material platform, using aqueous tetramethylammonium hydroxide (TMAH) in the PTD step. In some examples, for the subsequent image transfer of the EUV patterned structures into the underlying stack using reactive ion etch (RIE), a silicon-based hardmask layer directly located under the EUV resist is used in combination with selective etch processing. This hardmask can be a spin-on hybrid material, e.g. silicon-containing organic layer, or a vacuum-deposited inorganic layer such as polycrystalline silicon (p-Si) or amorphous silicon ($\alpha$-Si). In some instances, high silicon content is associated with high etch selectivity. Therefore, the vacuum-deposited inorganic layers, such as polycrystalline silicon (p-Si) or amorphous silicon ($\alpha$-Si) are often employed.

However, these materials are characterized by the presence of a native surface oxide layer ($SiO_x$) about 1 nm thick. The EUV resist structures feature poor adhesion to the silicon layer due to the acidic nature of the silanol (SiOH) termination of the $SiO_x$ surface layer. Typically, a surface priming process that replaces the hydrophilic SiO—H with a hydrophobic SiO—Si(CH$_3$)$_3$ termination is carried out utilizing vapor-applied hexamethyldisilazane (HMDS), which can improved adhesion of the EUV resist pattern to the silicon layer underneath.

However, the standard HMDS vapor priming process is insufficient at improving the adhesion of high resolution EUV patterns, such as tightly-pitched sub-20 nm EUV resist lines. Therefore, a method is needed to improve the adhesion of EUV photoresists to the silicon hardmask.

SUMMARY

The methods and structures described herein provide for improving the adhesion of high resolution EUV patterns over the insufficient adhesion properties of prior methods that employ hexamethyldisilazane (HMDS) vapor priming. In some embodiments, the methods disclosed herein can strip the top surface oxide layer (SiOx) from a provided silicon layer with diluted hydrofluoric acid (dHF) to generates silane (SiH) terminated silicon surface. In some embodiments, a vapor priming agent is provided bearing chemical functionality based on alkynes (C—C triple bond), alcohols (ROH), or the combination thereof to the SiH-terminated Si layer to form a hydrophobic organic surface. The EUV resist adhesion promotion methods that are described herein provide improved patterning fidelity on silicon hardmask during TMAH development.

In one embodiment, a patterning method that can be suitable for EUV lithography or E-beam lithography, in which the method includes providing a semiconductor surface to be patterned; and removing an oxide containing surface layer from the semiconductor surface that is to be patterned with a hydrofluoric (HF) based chemistry, wherein applying the HF base chemistry to the surface to be patterned forms a silane terminated surface. Thereafter, the method continues with the applying a vapor priming agent bearing chemical functionality based on alkynes to convert the silane terminated surface to a hydrophobic organic surface. A photoresist may then be formed on the hydrophobic organic surface to be patterned, and the photoresist can be patterned. In a following step, the photoresist is developed on the surface to be patterned using positive and/or negative tone development (NTD).

In another embodiment, a patterning method that can be suitable for EUV lithography or E-beam lithography, in which the method includes providing a semiconductor surface composed of a type IV semiconductor material to be patterned; and removing an oxide containing surface layer from the semiconductor surface that is to be patterned with an HF base chemistry, wherein applying the HF base chemistry to the surface to be patterned forms a silane terminated surface. Thereafter, the method continues with the applying a vapor priming agent bearing chemical functionality based on alcohols to convert the silane terminated surface to a hydrophobic organic surface. A photoresist may then be formed on the hydrophobic organic surface to be patterned, and the photoresist can be patterned lithographically using an extreme ultra violet (EUV) method. In a following step, the photoresist is developed on the surface to be patterned using positive and/or negative tone development (NTD).

In another aspect, an etch process that can be suitable for EUV lithography or E-beam lithography is provided that in one embodiment can include providing a semiconductor surface to be etched; and removing an oxide containing surface layer from the semiconductor surface to be etched by applying a hydrofluoric (HF) based chemistry, wherein the hydrofluoric (HF) based chemistry terminates the semiconductor surface to be etched with silicon-hydrogen bonds. Thereafter, the method continues with the applying a vapor priming agent bearing chemical functionality based on the group consisting of alkynes, alcohols and a combination thereof to convert the silane terminated surface to a hydrophobic organic surface. A photoresist may then be formed on the hydrophobic organic surface to be patterned, and the photoresist can be patterned lithographically using an extreme ultra violet (EUV) method. In a following step, the photoresist is developed on the surface to be patterned using positive and/or negative tone development (NTD). Thereafter, the method continues with etching the portions of the semiconductor surface exposed by the mask, while the portions of the semiconductor surface that are underlying the mask are not etched.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Principles and embodiments of the present invention relate generally to fabricating microelectronics structures, and the resulting structures formed thereby, using extreme ultraviolet (EUV) lithographic and electron beam (E-beam) processes. Patterning of small features generated by extreme ultraviolet (EUV) and E-beam lithography can be limited by a variety of factors, from the photoresist over the substrate to the developer.

The methods and structures described herein provide for improved adhesion promotion for photoresist material layers used in EUV and R-beam lithography. In some embodiments, the method includes stripping the top surface oxide layer, e.g., silicon oxide ($SiO_x$) layer, from a silicon containing layer, or other type IV semiconductor surface, with a hydrofluoric containing chemistry, such as diluted hydrofluoric acid (dHF), to generate a silane (SiH) terminated silicon surface and delivering a vapor priming agent bearing chemical functionality based on alkynes (C—C triple bond), alcohols (ROH), or a combination thereof to the SiH-terminated Si layer to form a hydrophobic organic surface. It has been determined that in some embodiments the formation of the hydrophobic organic surface promotes resist adhesion, and provides improved patterned fidelity, e.g., provides improved EUV resist adhesion and provides improved patterning fidelity on silicon hardmask during TMAH development when compared to prior methods that employ surface priming with hexamethyldisilazane (HMDS). The patterning/etching processes for EUV and E-beam lithography that employ the above described adhesion/fidelity promotion schemes are now described with more detail with reference to FIGS. 1-11.

Figure 1:
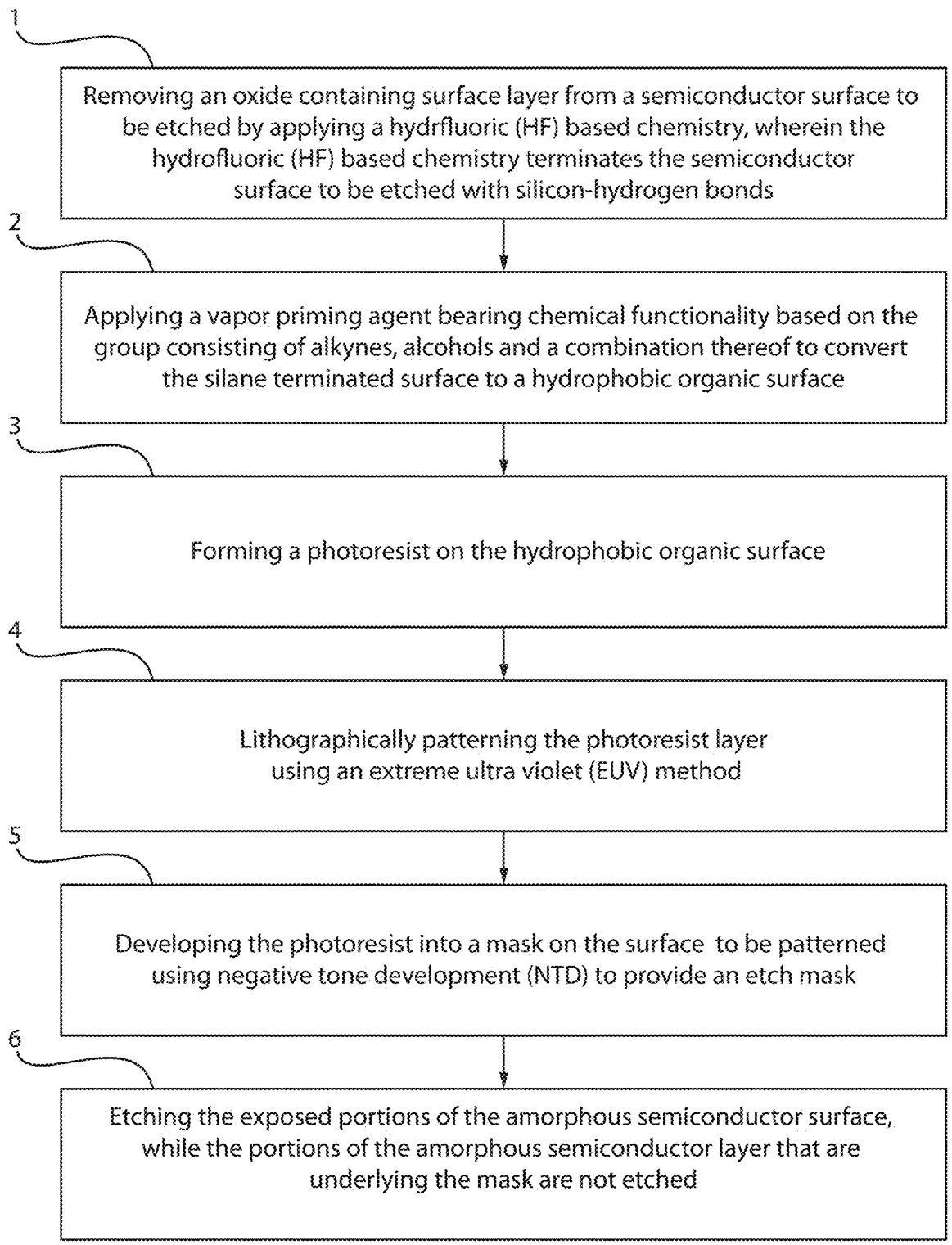
FIG. 1 is a flow diagram illustrating one embodiment of an etch method using the photolithography process that includes the steps of removing an oxide containing surface layer from the semiconductor surface that is to be patterned with a hydrofluoric (HF) based chemistry, and applying a vapor priming agent bearing chemical functionality based on alkynes and/or alcohols to convert the silane terminated surface to a hydrophobic organic surface, in accordance with one embodiment of the present disclosure.
Figure 2:
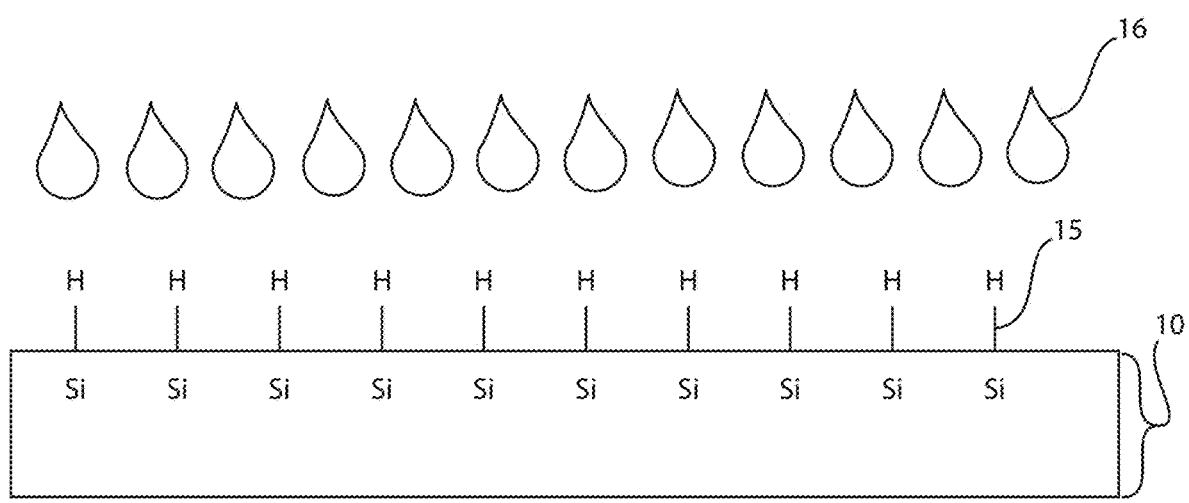
FIG. 2 is a side cross-sectional view depicting one embodiment of providing a semiconductor surface to be etched, and terminating the amorphous semiconductor surface by forming silicon-hydrogen (Si—H) bonds. i.e., silane terminated surface, on the surface to be patterned, in accordance with one embodiment of the present disclosure.

In some embodiments, the method can begin with providing a semiconductor surface 10 to be etched, and terminating the semiconductor surface by forming silicon-hydrogen (Si—H) bonds 15 on the surface to be patterned at Step 1 of the process flow depicted in FIG. 1, as illustrated in FIG. 2. In some embodiments, the semiconductor surface 10 may be provided by an amorphous semiconductor material. The term "amorphous" denotes that the semiconductor material does not have a regular repeating crystalline structure. In some examples, the semiconductor surface 10 may be entirely amorphous, e.g., amorphous silicon (α-Si), and may also include an amorphous matrix with islands of crystalline material, such as in microcrystalline silicon or nanocrystalline silicon. Although FIG. 2 depicts that the semiconductor surface 10 is an independent layer, other embodiments have been contemplated in which the semiconductor surface 10 is a component of a material stack of other semiconductor materials, such as type IV and type III-V semiconductor materials, that may have crystalline, e.g., single crystalline, or amorphous crystal structures; or the semiconductor surface 10 may be present atop a supporting substrate, which may be composed of a semiconductor material, e.g., type IV and/or type III-V. It is not required that the supporting substrate be composed of semiconductor material, as other dielectric materials, such as oxides, nitrides and glass compositions, and metal materials may be suitable for providing a supporting substrate for the semiconductor surface 10. In some examples, the supporting substrate for the semiconductor surface 10 may be a polymeric material.

The semiconductor surface 10 typically includes a "native oxide". The term "native oxide" can refer to an oxide containing layer that forms on the semiconductor surface 10 from its exposure to air or other oxygen containing atmosphere. The native oxide is typically a thin layer, which can be on the order of 2 nm or less in thickness, in some instances being less than 1 nm in thickness. In some examples, when the semiconductor surface 10 is composed of silicon (Si), the native oxide may be a silicon oxide containing layer, e.g., silicon oxide ($SiO_2$).

At step 1 of the process flow that is described in FIG. 1, the native oxide that is present on the semiconductor surface 10 is typically removed by applying a hydrofluoric (HF) based chemistry 16 that terminates the semiconductor surface 10 to be etched with silicon hydrogen (Si—H) bonds 15, as depicted in FIG. 2. In some embodiments, prior to applying the dilute hydrofluoric acid (dHF) rinse 16, the semiconductor surface 10 may be cleaned using one of acetone, methanol, and deionized water. In some embodiments, when the semiconductor surface 10 is composed of amorphous silicon (α-Si), the semiconductor surface 10 can be treated with a wet chemical rinse of a hydrofluoric (HF) containing chemistry 16, e.g., a dilute hydrofluoric acid (dHF) composition 26, which terminates the amorphous silicon with hydrogen to silicon (Si—H) bonding. It is noted that prior to being terminated with semiconductor-hydrogen bonding, e.g., silicon-hydrogen (Si—H) bonding, the dilute HF rinse may remove any naturally forming oxide, e.g., silicon oxide, that may be present on the semiconductor surface 10.

Figure 3:
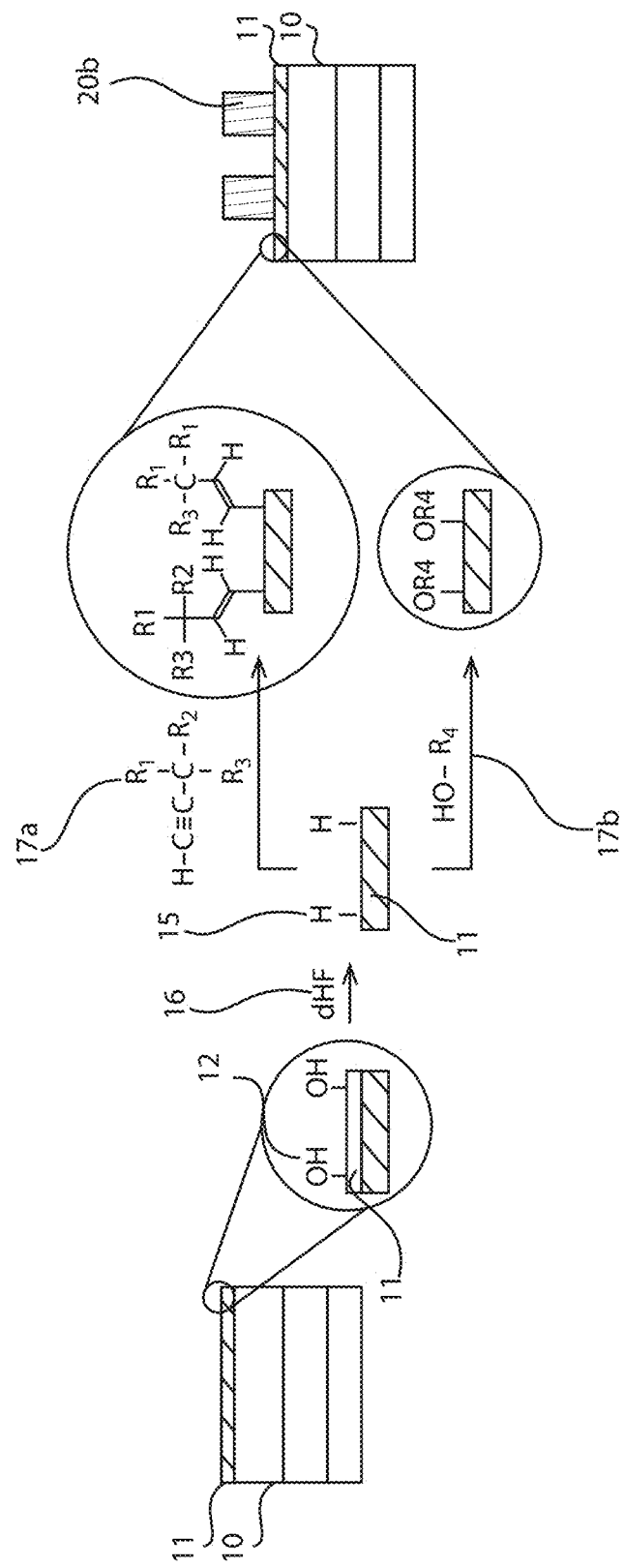
FIG. 3 is an illustration depicting the surface reactions that occur at the semiconductor surface to be etched in accordance with one embodiment of the method described herein.

FIG. 3 illustrates the native oxide 11 that is present on the semiconductor surface 10, in which the native oxide 11 may include an hydroxide (OH) functionalized surface 12. FIG. 3 further depicts that the application of the hydrofluoric (HF) containing chemistry 16. e.g., dilute hydrofluoric acid (dHF), removes the native oxide, and converts the hydroxide (OH) functionalized surface 12 to a silane functionalized surface 15a, which includes silicon hydrogen (Si—H) bonds 15. In the example that is depicted in FIG. 3, the semiconductor surface 10 may be amorphous silicon (α-Si), and the hydrofluoric (HF) containing chemistry may be dilute hydrofluoric acid (dHF).

In one example, the dilute hydrofluoric acid (dHF) rinse that is used to remove the native oxide 11, and terminate the semiconductor surface 10 with silicon-hydrogen (Si—H) bonds 15, i.e., form a silane terminated surface, can include a very highly diluted HF mixture, e.g., less than 0.1%. The dilute hydrofluoric (dHF) acid rinse is an aqueous solution. It is noted that the previous example of a 0.1% diluted HF mixture is only one example of a diluted HF (dHF) rinse that is suitable for terminating the amorphous semiconductor layer 10. For example, the dilute HF (dHF) rinse may include hydrofluoric acid (dHF) in amounts equal to 10%, 5%, 3%, 1%, 0.5%, 0.3%, 0.1%, 0.09%, 0.08%, 0.07%, 0.06%, 0.05%, 0.04%, 0.03%, 0.02%, 0.01%, as well as any range including one of the aforementioned examples for the maximum value of the range, and one of the aforementioned examples for the minimum value of the range. It is noted that the HF-based chemical is not limited to only the aforementioned dHF solution. For example, in some embodiments the HF-based chemical may be a buffered hydrofluoric acid (BHF) solution, which is a mixed solution of dHF and $NH_4F$.

The HF-based chemical, e.g., dilute hydrofluoric acid (dHF) rinse, may be applied by dipping the semiconductor surface 10 into a dHF bath. In other embodiments, the dilute hydrofluoric acid (dHF) rinse may be applied by pouring, e.g., via curtain pouring, the dHF onto the semiconductor surface 10. In yet other embodiments, the dilute hydrofluoric acid (dHF) rinse is applied by spray and/or brush.

The application of the HF-based chemical, e.g., dilute HF (dHF) rinse, may be at room temperature, e.g., 20° C. or 25° C. at 1 atm. In some embodiments, the temperature for the application of the HF-based chemical, e.g., dilute HF (dHF) rinse, may be at a temperature elevated from room temperature. For example, in some instances, the temperature for the application of the HF-based chemical, e.g., dilute HF (dHF) rinse, can range from 70° C. to 80° C.

Because the native oxide 11, e.g. silicon oxide ($SiO_2$), that is present on the semiconductor surface 10 is relatively thin. e.g., less than 1 nm, the concentration of the HF-based chemistry may be dilute, e.g., dHF, and the time period for the application of the HF-based chemical, e.g., dHF, may be relatively short. For example, the processing time for the application of the HF-based chemical, e.g., dHF, that removes the native oxide and terminates the semiconductor surface 10 may be applied for a time period of 1 minute or less. It is noted that the above example is provided for illustrative purposes only, and is not intended to limit the present disclosure. For example, the application time for the HF-based chemical, e.g., dilute HF (dHF) rinse, may be equal to 5 seconds, 15 seconds, 30 seconds, 1 minute, 2 minutes, 3 minutes, 5 minutes, 10 minutes, 15 minutes, 30 minutes and 1 hour, as well as any range including one of the aforementioned examples for the maximum value of the range, and one of the aforementioned examples for the minimum value of the range.

Following application of the HF-based chemical, e.g., dHF, that removes the native oxide and terminates the semiconductor surface 10 with silicon-hydrogen (Si—H) bonds, the now terminated semiconductor surface 10 may be rinsed with deionized water. In some examples, any acidity may be neutralized using a more basic composition to neutralize and rinse the terminated surface.

Stripping the native oxide 11 with a HF-based chemical rinse, such as dHF, converts the terminal surface functionality from polar (Si—OH) to non-polar (Si—H). It is noted that termination of the semiconductor surface 10 can form silicon-hydrogen (Si—H) bonds in the form of Si—H, $\equiv$SiH, $=SiH_2$, $—SiH_3$, or a combination thereof. Silane terminated (Si—H) surfaces are non-polar. However. Si—H bonds react with aqueous bases, such as tetramethylammonium hydroxide (TMAH) developer. It has been determined that TMAH developer can lift off photoresist patterns, particularly small features, in the development stage of the lithography process.

Figure 4:
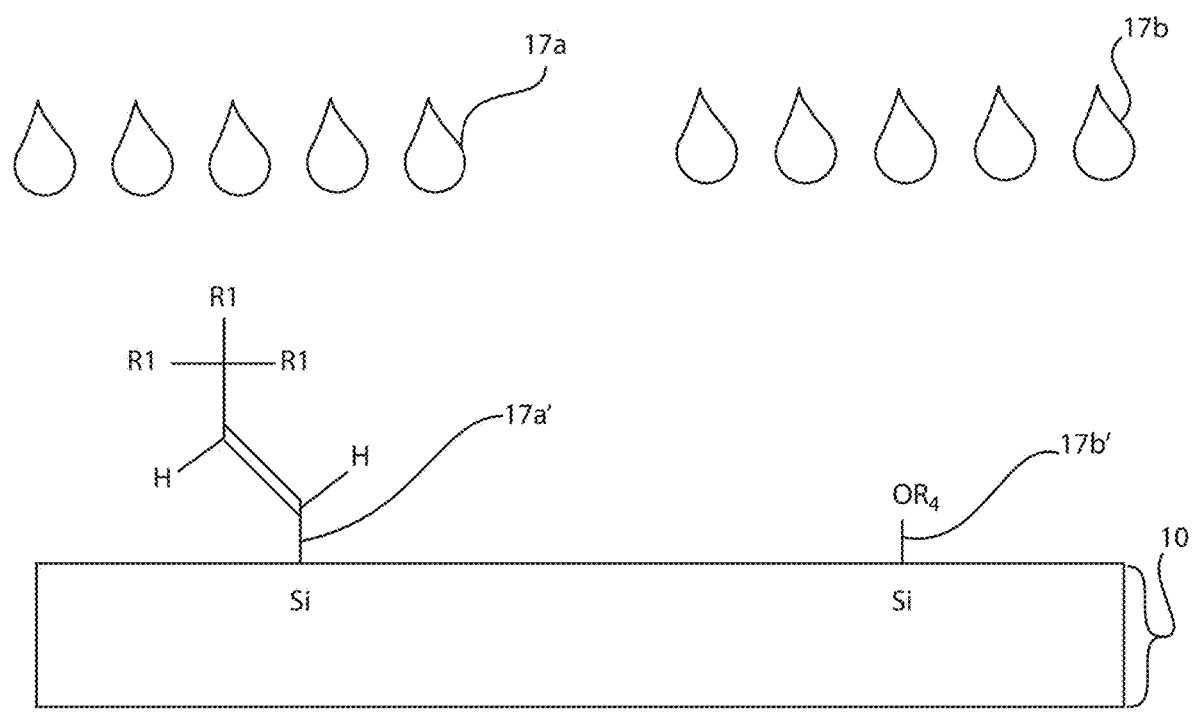
FIG. 4 is a side cross-sectional view depicting applying a vapor priming agent bearing chemical functionality based on alkynes and/or alcohols to convert the silane terminated surface to a hydrophobic organic surface, in accordance with one embodiment of the present disclosure.
Figure 5:
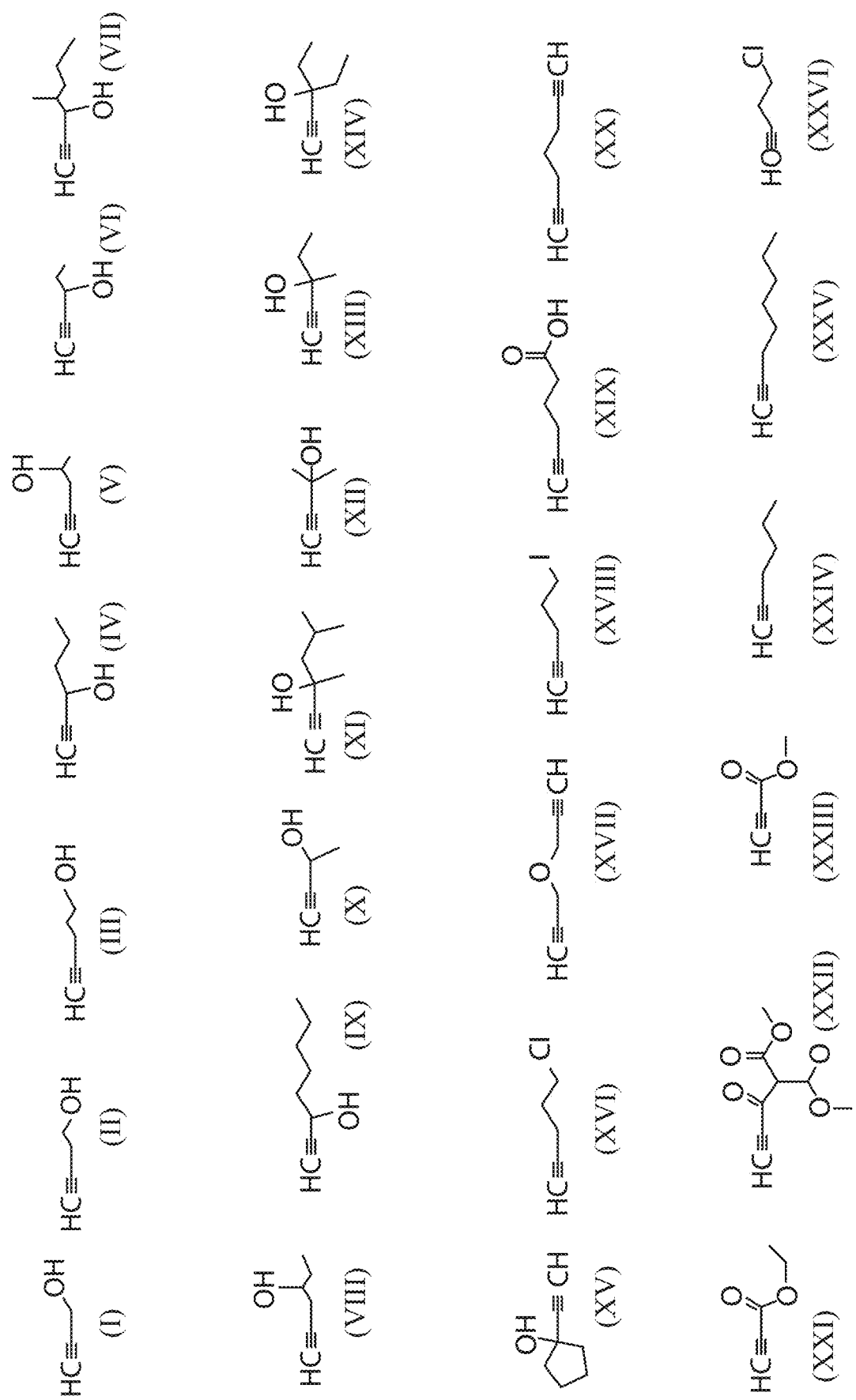
FIG. 5 is a list of vapor priming agents based on alkynes and/or alcohols, suitable for the conversion of a silane terminated surface into a hydrophobic organic surface, in accordance with one embodiment of the present disclosure.

To overcome the effects of tetramethylammonium hydroxide (TMAH) developer on the non-polar silicon hydrogen (Si—H) bond termination that results from the reaction of the hydrofluoric containing chemistry, e.g., dilute hydrofluoric acid, with the semiconductor surface 10, the method continues with priming the Si—H terminated surface with alkynes, alcohols or a combination thereof at step 2 of the process flow depicted in FIG. 1. Referring to FIG. 4. In some embodiments, the method can continue with delivering a vapor priming agent 17a, 17b based on alkynes (C—C triple bond), alcohols (ROH), or a combination thereof to convert the silane (Si—H) terminated surfaces to a hydrophobic organic surface, i.e., polar surface. The term "hydrophobic" means tending to repel or fail to mix with water. The term "hydrophilic" refers to a surface having a strong affinity for water. An "alkyne" is an unsaturated hydrocarbon containing at least one carbon-carbon triple bond. Examples of alkynes based priming agents 17a include 5-chloro-1-pentyne (reference numeral XVI). Propargyl ether (reference numeral XVII). Iodo-1-pentyne (reference numeral XVIII), 5-Hexynoic acid (reference numeral XIX), 1,7-Octadiyne (reference numeral XX). Ethyl propiolate (reference numeral XXI), Dimethyl propargylmalonate (reference numeral XXII), Methyl propiolate (reference numeral XXIII), 1-Hexyne (reference numeral XXIV), 1-Octyne (reference numeral XXV), 3-Chloro-1-propanol (reference numeral XXVI), and combinations thereof, in which roman numerals are used to correlate the chemical structural illustrated in FIG. 5 to the aforementioned examples. An alcohol is any organic compound in which the hydroxyl functional group (—OH) is bound to a saturated carbon atom. Examples of alcohol based priming agents 17b include 2-Propyn-1-ol (reference numeral I), 3-Butyn-1-ol (reference numeral II), 4-Pentyn-1-ol (reference numeral III), 1-Hexyn-3-ol (reference numeral IV), 4-Pentyn-2-ol (reference numeral V), 1-Pentyn-3-ol (reference numeral VI), 4-Methyl-1-heptyn-3-ol (reference numeral VII), 5-Hexyn-3-ol (reference numeral VIII), 1-Octyn-3-ol (reference numeral IX), 3-Butyn-2-ol (reference numeral X), 3,5-Dimethyl-1-hexyn-3-ol (reference numeral XI), 2-Methyl-3-butyn-2-ol (reference numeral XII), 3-Methyl-1-pentyn-3-ol (reference numeral XIII), 3-Ethyl-1-pentyn-3-ol (reference numeral XIV), 1-Ethynylcyclopentanol (reference numeral XV), and combinations thereof, in which roman numerals are used to correlate the chemical structural illustrated in FIG. 5 to the aforementioned examples. It is noted that the above examples are illustrative and not limiting. Suitable alkynes, alcohols and alkyn-ols are those which are liquids at room temperature (melting point below 20 C) and have a boiling point below 250 C, most preferable between 120° and 170° C., in order to provide sufficient vapor pressure and maintain the flash point above 100° F. (37° C.).

The vapor priming agent 17a, 17b based on alkynes (C—C triple bond), alcohols (ROH), or a combination thereof is typically applied using a spray method, but in other instances, the vapor priming agent 17a, 17b may be applied using a curtain deposition method. Although the priming agent is described as a vapor the present disclosure is not limited to only this example. For example, the priming agent (having the compositions listed above and depicted in FIG. 5) may also be applied to the surface to be patterned in liquid form, using spraying, dipping, brushing and curtain coating methods.

The vapor priming agent 17a, 17b may be applied using a carrier gas such as nitrogen ($N_2$) carrier gas. Other carriers gasses that may be suitable for use with the methods described herein can include hydrogen, helium, argon and combinations thereof.

The temperature for the vapor priming agent 17a, 17b may be approximately room temperature, e.g., ranging from 20° C. to 25° C., at 1 ATM. In some instances, raising the temperature at which the vapor priming agent 17a, 17b is applied can decrease the application time. In some embodiments, the vapor priming agent 17a, 17b is applied at a temperature ranging from 50° C. to 250° C., for a time period ranging from 5 seconds to 5 hours. In another embodiment, the vapor priming agent 17a, 17b is applied at a temperature ranging from 100° C. to 200° C., for a time period ranging from 1 minute to 5 minutes. In yet another embodiment, the vapor priming agent 17a, 17b is applied at a temperature ranging of 150° C., for a time period ranging from 1 minute to 5 minutes.

Referring to FIGS. 3 and 4, the vapor priming agent 17 based on alkynes (C—C triple bond), alcohols (ROH), or a combination thereof when applied to the surface of the semiconductor surface 10 reacts with the silicon-hydrogen bonds so that the alcohols and alkynes react with the silicon-hydrogen bonds to form a chemical bond, which in some embodiments can be as follows:

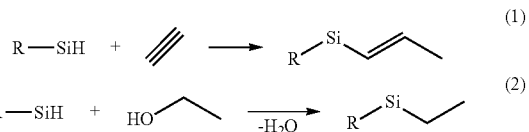

As depicted in FIGS. 3 and 4, in some embodiments, the terminal silicon is capped and becomes resistant to base attack. The product produced by reaction of the vapor priming agent based on alkynes (C—C triple bond) 17a that reacts with the Si—H bonded surface is identified by reference number 17a'. The product produced by reaction of the vapor priming agent based on alcohol (—OH) 17b that reacts with the Si—H bonded surface is identified by reference number 17b'. The terminal silicon has been capped and becomes resistant to base attack. In some embodiments, the organic pendant groups can be tailored to match, or mismatch, a photoresist to be coated onto it. The reaction provided by the vapor priming agent 17 based on alkynes (C—C triple bond), alcohols (ROH), or a combination thereof when applied to the surface of the semiconductor surface 10 reacts with the silicon-hydrogen bonds to provide a hydrophobic organic surface that can significantly improve resist adhesion during development using tetramethylammonium hydroxide (TMAH) or like developers, such as those used during positive tone resist development and/or negative tone resist development.

Figure 6:
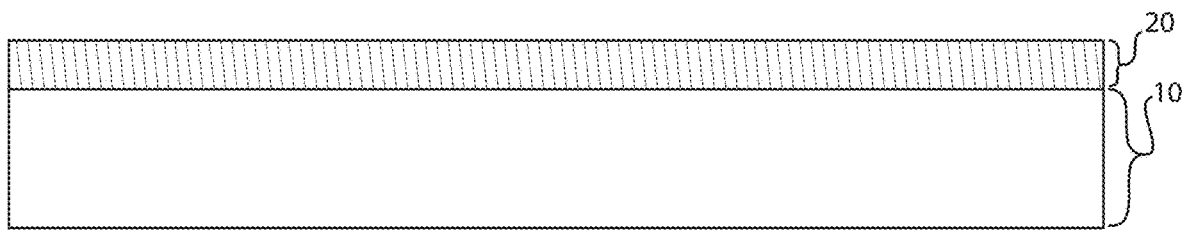
FIG. 6 is a side cross-sectional view depicting forming a photoresist on the surface to be patterned.

Referring to FIG. 1, the method may continue with forming a forming a photoresist layer 20 on the semiconductor surface 10 to be patterned at step 3, as depicted in FIG. 6. The photoresist layer 20 that is deposited is suitable for positive tone development (PTD), but in some embodiments the methods disclosed herein are equally applicable to negative tone development (NTD). The image of the mask features is intended to be transferred to a photoresist on the substrate. Typically, in positive tone photoresist development the exposed area, i.e., area exposed to lithographic radiation, is made soluble in the developer. In negative tone photoresist development the exposed area. i.e., area exposed to lithographic radiation, is made insoluble to the developer.

The process flow described herein is suitable for photoresist materials that are developed using tetramethylammonium hydroxide (TMAH), or a tetramethylammonium hydroxide (TMAH) like developer. Therefore, any photoresist, whether a positive tone resist (PTR) or negative tone resist (NTR) may benefit from the improved adhesion provided by the method described herein for use with tetramethylammonium hydroxide (TMAH) or tetramethylammonium hydroxide (TMAH) like developers. In some embodiments, photoresists that can provide the photoresist layer 20 may be phenolic, acrylic or hybrid (phenolic-acrylic) chemically amplified photoresists.

In a first embodiment, a phenolic photoresist layer 20 is provided that can be a copolymer of polyhydroxystyrene modified with a ketal-based protecting group or a tert-butyloxycarbonyl protecting group. The phenolic photoresist layer 20 can be formulated by dissolution of the phenolic resin, a suitable photoacid generator such as triphenylsulfonium perfluorobutanesulfonate and a base quencher such as tetrabutylammonium lactate in an organic solvent such as propylene glycol monomethyl ether acetate. The thickness of the deposited layer may be smaller than 100 nm. For example, the thickness of the deposited photoresist layer 20 may range from 50 nm to 30 nm in order to make it suitable for high resolution patterning, i.e., for the patterning of sub-40 nm pitched structures.

In another embodiment, an acrylic photoresist layer 20 is suitable for use with the methods described herein, wherein the acrylic photoresist layer 20 can be a copolymer of norbornane lactone methacrylate (NLM) and methyl adamantane methacrylate (MAdMA). The acrylic photoresist layer 20 can be formulated by dissolution of the acrylic resin, a suitable photoacid generator such as triphenylsulfonium perfluorobutanesulfonate, and a base quencher, such as tetrabutylammonium lactate in an organic solvent such as cyclohexanone. The thickness of the deposited layer may be smaller than 100 nm. For example, the thickness of the deposited photoresist layer 20 may range from 30 nm to 50 nm in order to make it suitable for high resolution patterning. i.e., for the patterning of sub-40 nm pitched structures.

In another embodiment, a hybrid photoresist layer 20 can be a copolymer of polyhydroxystyrene and methyl adamantane methacrylate (MAdMA). The hybrid photoresist layer 20 can be formulated by dissolution of the hybrid resin, a suitable photoacid generator such as triphenylsulfonium perfluorobutanesulfonate and a base quencher such as tetrabutylammonium lactate in an organic solvent such as propylene glycol monomethyl ether acetate. The thickness of the deposited layer may be smaller than 100 nm. For example, the thickness of the deposited photoresist layer 20 may range from 50 nm to 30 nm in order to make it suitable for high resolution patterning, i.e., for the patterning of sub-40 nm pitched structures.

It is noted that the above examples of photoresist compositions are provided for illustrative purposes only, and are not intended to limit the present disclosure. Other compositions for photoresists are also applicable to the present disclosure including polymers, such as polycarbonates, polyimides, polyesters, polyalkenes, copolymers thereof and combinations thereof.

In general, any suitable coating process can be used to deliver the photoresist layer 20 to the semiconductor surface that has been treated using a vapor priming agent based on alkynes (C—C triple bond), alcohols (ROH), or a combination thereof. Suitable coating approaches can include, for example, spin coating, spray coating, dip coating, knife edge coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein. The coating material can be applied in multiple coating steps to provide greater control over the coating process. For example, multiple spin coatings can be performed to yield an ultimate coating thickness desired. The thickness of the deposited layer may range from 1 nm to 500 µm. In some embodiments, the photoresist has a thickness of less than 50 nm.

In one embodiment, the photoresist layer 20 may be deposited using spin on deposition methods, in which the spin rate for the substrate may range from 500 rpm to 10.000 rpm.

Following deposition of the photoresist layer 20, the method may continue with heating or evaporation of the solvent to harden the photoresist layer. The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. In general, the coating material can be heated prior to radiation exposure to further drive off solvent and promote densification of the coating material.

While heating is not needed for successful application of the process, it can be desirable to heat the coated substrate to speed the processing and/or to increase the reproducibility of the process. In embodiments in which heat is applied to remove solvent, the coating material can be heated to temperatures from 45° C. to 150° C. in further embodiments from 50° C. to 130° C. and in other embodiments from 60° C. to 110° C. The heating for solvent removal can generally be performed for at least about 0.1 minute, in further embodiments from about 0.5 minutes to about 30 minutes and in additional embodiments from about 0.75 minutes to about 10 minutes. This heating process may be referred to as post-apply bake (PAB).

Figure 7:
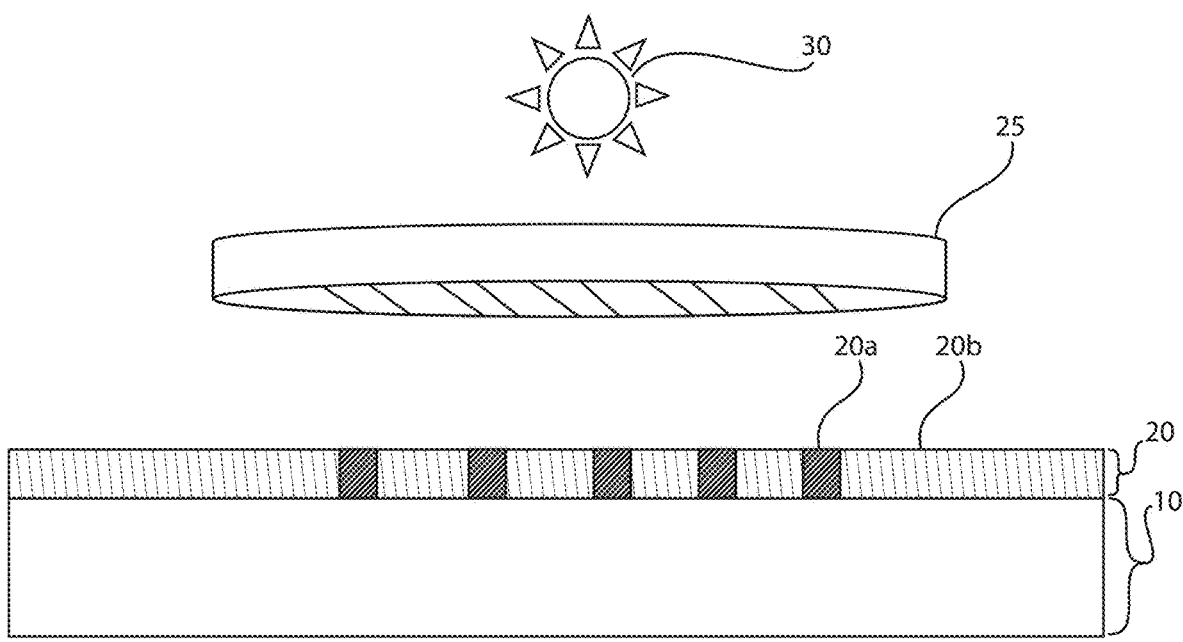
FIG. 7 is a side cross-sectional view depicting lithographically patterning the photoresist layer using an extreme ultra violet (EUV) method.

Referring to FIG. 1, following formation of the photoresist layer 20, the method may continue with lithographically patterning the photoresist layer using an extreme ultra violet (EUV) method at step 4, as illustrated in FIG. 7. In some examples, a pattern is formed using a reticle or photomask 25 and transferred into the photoresist layer 20. Light is reflected off the multi-mirrored surface of the reticle, which in turn produces a patterned image on the layer of photoresist. For example, exposure to light may change the exposed portions 20a of the photoresist from an insoluble condition to a soluble one, as in the case of positive tone resist. The exposed portion 20b of the photoresist is dissolved by the photoresist developer.

The light source 30 may be an EUV light source. EUV light sources designed for lithography tools typically have high average power (e.g., 100 W and above) at 2% bandwidth with a central wavelength of 13.5 nm. Such systems typically employ a laser produced plasma (LPP) with a metal target (e.g., Sn) and a high power laser (e.g., $CO_2$ with wavelength of 10.6 µm). Such a combination is well suited for achieving high conversion efficiency (up to 4-5% in band) and high average power (about 100 W and above). In some embodiments to provide an EUV light source, a laser source is provided for initiating and/or maintaining a plasma. In this regard, the laser source may supply the energy required to rapidly heat the plasma-forming target material to a plasma, which, in turn, emits EUV light, i.e., the light source 30.

In one embodiment, the drive laser source may include, but is not limited to, one or more drive lasers. The number and type of lasers used in the drive laser source may depend on a number of factors including, but not limited to, the required power output of the individual lasers, the desired EUV light power output, and the efficiency of the EUV light generation process. As an example, EUV light is used by photolithography mask inspection systems, but such systems do not require the high EUV light power output of primary photolithography systems. An EUV mask inspection system may only require EUV light in the range of 10 W, but with high brightness in a small area. In the case of mask inspection systems, total laser output in the range of a few kilowatts is needed, with the output being focused onto a small target spot (e.g., less than 100 μm in diameter).

The drive source may include any pulsed or modulated illumination source known in the art. For example, the drive laser source may include, but is not limited to, a pulsed laser. In one embodiment, the drive laser source may include, but is not limited to, one or more solid state lasers. For example, the drive laser source may include, but is not limited to, one or more Nd:YAG, Er:YAG, Yb:YAG, Ti:Sapphire, Nd:Vanadate, and like lasers. In another embodiment, the drive laser source may include, but is not limited to, a gas-discharge laser. For example, the drive laser source may include, but is not limited to, one or more excimer lasers. In another embodiment, the drive laser source may include, but is not limited to, any laser system capable of emitting light having a wavelength less than 1 μm.

In one embodiment, the one or more laser pulses of beam to provide the light source 30 may include a train of pulses with duration in the range of 5 to 50 ns. In another embodiment, the total average power of the beam outputted by the laser source may be in the range of 1-10 kW. In another embodiment, the combination of multiple laser outputs may include triggering multiple lasers synchronously.

Although the light source 30 used for patterning the photoresist is typically an EUV light source, the methods disclosed herein are also applicable to immersion photolithography. e.g., 193 nm lithography, as well as e-beam lithography.

Referring to FIG. 1, following lithographically patterning the photoresist layer 20, 20a, 20b, the method may continue with a hard bake. In general, the coating material can be heated post-radiation exposure to catalyze the cleavage of the protective group from the photoresist layer 20 in order to promote the desired solubility switch. This heating process may be referred to as post-exposure bake (PEB).

Figure 8:
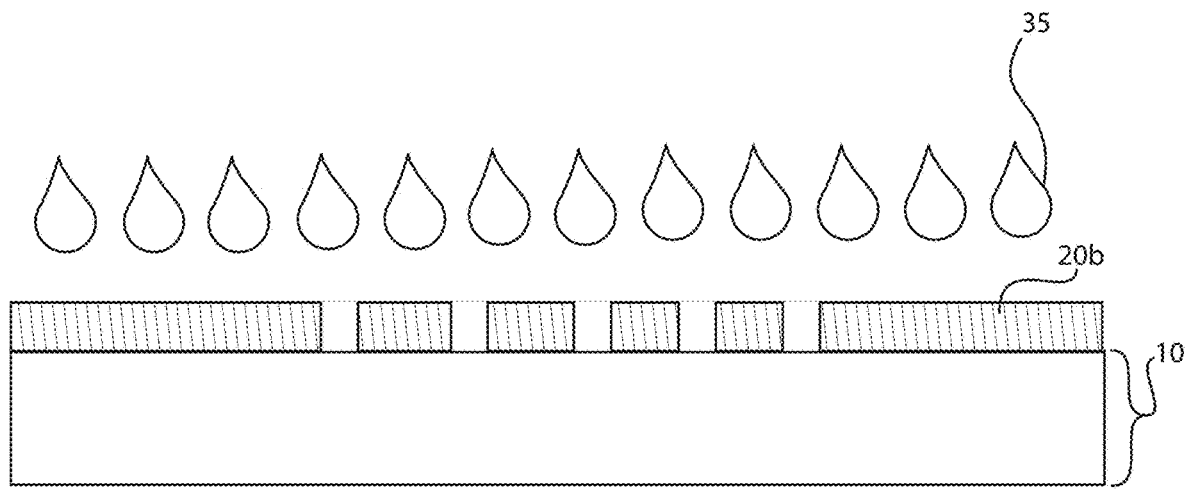
FIG. 8 is a side cross-sectional view depicting a photoresist being developed into a mask on the surface to be patterned.

In embodiments in which heat is applied to drive the deprotection reaction of the chemically amplified resist, the coating material can be heated to temperatures from 45° C. to 150° C., in further embodiments from 50° C. to 130° C. and in other embodiments from 60° C. to 110° C. The post-exposure bake (PEB) can generally be performed for at least about 0.1 minute, in further embodiments from about 0.5 minutes to about 30 minutes and in additional embodiments from about 0.75 minutes to about 10 minutes. Referring to FIG. 1, following post-exposure baking of the photoresist layer 20, 20a, 20b, the method may continue with a development step that removes the portions of the photoresist layer 20a that were exposed selectively to the unexposed portions of photoresist layer 20b at step 5, as illustrated in FIG. 8. Development of the image involves the contact of the patterned photoresist layer 20 including the latent image to a developer composition 35 to remove the irradiated photoresist portions 20a.

In one embodiment, the developer composition 35 can be tetramethyl ammonium hydroxide (TMAH). Commercial TMAH is available at 2.38 weight percent, and this concentration can be used for the processing described herein. However, in some embodiments, the developer composition 35 can be delivered at higher concentrations relative to the concentrations generally used for the development of organic resists, such as 25% by weight TMAH. The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired, spin rinsing and/or drying can be used to complete the development process. Suitable rinsing solutions include, for example, ultrapure water, methyl alcohol, ethyl alcohol, propyl alcohol, 4-methyl-2-pentanol and combinations thereof.

As noted above, the prior method to improve adhesion and pattern performance on silicon (Si), e.g., amorphous silicon (α-Si), crystalline silicon (c-Si), and combinations thereof, or silicon oxide. e.g., low temperature oxide (LTO) substrates was priming the surface to be patterned with hexamethyldisazane (HMDS). As noted above, it has been determined that resist adhesion under these circumstances is marginal for resolution patterning in the sub 40 nm pitch realm (sub-40P). This is especially the case for photoresist layers developed using tetramethyl ammonium hydroxide (TMAH). It has been determined that using the methods described above, amorphous silicon (α-Si) or crystalline silicon (c-Si) can be stripped off their native oxide, e.g., silicon oxide, without HDMS using the an HF-based chemical, such as dilute HF, thereby converting the terminal surface functionality to silicon-hydrogen bonds. It has further been determined that the silicon-hydrogen bonded surface can be converted to a hydrophobic organic surface, i.e., polar surface, by the application of a vapor priming agent 17a, 17b based on alkynes (C—C triple bond), alcohols (ROH), or a combination thereof. The formation of the hydrophobic organic surface provides for increased adhesion and fidelity of patterned photoresist layers developed using tetramethyl ammonium hydroxide (TMAH).

Figure 9:
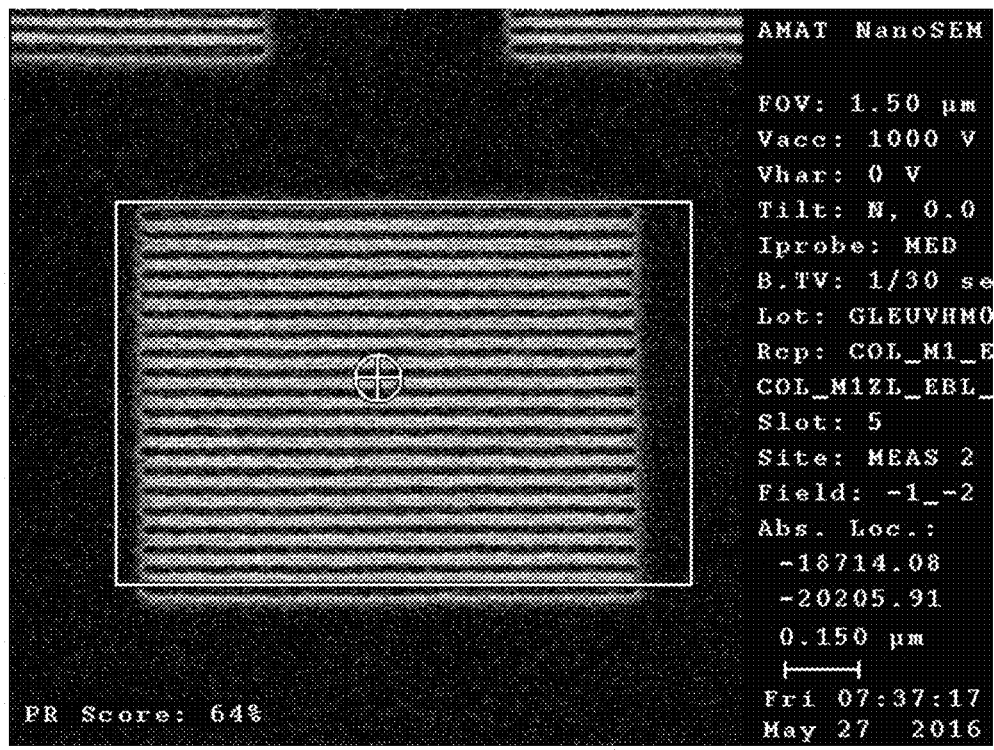
FIG. 9 is a scanning electron microscope (SEM) image of a developed resist that was formed on an amorphous silicon surface that was treated with a dilute hydrofluoric acid (dHF) rinse followed by applying a vapor priming agent bearing chemical functionality based on alkynes and/or alcohols to convert the silane terminated surface to a hydrophobic organic surface prior to forming the photoresist layer, in accordance with one embodiment of the present disclosure.

FIG. 9 is a scanning electron microscope (SEM) image of a developed resist that was formed on an amorphous silicon surface that was treated with a dilute hydrofluoric acid (dHF) rinse followed by applying a vapor priming agent to convert the silane terminated surface to a hydrophobic organic surface prior to forming the photoresist layer. The image depicted in FIG. 9 was provided by an amorphous (α-Si) layer that was treated with dilute hydrofluoric acid (dHF) to generate the SiH terminated surface. Subsequently, the surface was primed with 3,5-dimethyl-1-hexyn-3-ol (an alkyn-ol known under the commercial tradename "Surfynol 61") at 150° C. and atmospheric pressure with $N_2$ carrier gas, prior to coating of an EUV resist and e-beam patterning with TMAH development. The photoresist patterned on the alkynol-primed aSi surface illustrated good feature printability.

Figure 10:
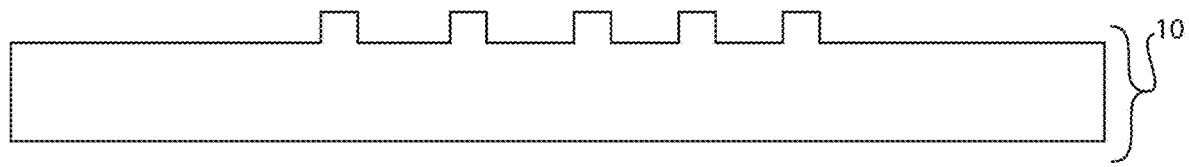
FIG. 10 is a side cross-sectional view depicting one embodiment of etching the exposed portions of the amorphous semiconductor surface, while the portions of the amorphous semiconductor layer that are underlying the mask are not etched.

Referring to FIG. 1, following development of the lithographically patterning the photoresist layer, the method may continue with etching the underlying amorphous semiconductor layer 10 at step 6, as illustrated in FIG. 10. The etch process for etching the underlying semiconductor layer 10 is selective to the remaining portions of the photoresist layer 20b that provide a photoresist mask. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

In one embodiment, the semiconductor layer 10 may be etched using an anisotropic etch. As used herein, an "anisotropic etch process" denotes a material removal process in which the etch rate in the direction normal to the surface to be etched is greater than in the direction parallel to the surface to be etched. The anisotropic etch may be reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In some embodiments, the semiconductor layer 10 is etched to provide an ultrathin, e.g., less than 5 nm thick, patterned inorganic hardmask. e.g., a patterned inorganic hardmask composed of amorphous silicon (α-Si). The methods and structures disclosed herein may also be used to form a patterned hard mask that is composed of low temperature oxide (LTO) material.

The methods and structures described herein provide better resist thickness budget, higher etch selectively, lower line width roughness (LWR), improved defectivity, and increased wet strippability of materials used in photolithography processes.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device comprising:
    removing an oxide containing surface layer from a semiconductor surface that is to be patterned with a fluoride based chemistry, wherein applying the fluoride based chemistry to the surface to be patterned forms a terminated surface;
    applying a priming agent bearing chemical functionality based on alkynes to convert the terminated surface to a hydrophobic organic surface;
    patterning a photoresist layer on the hydrophobic organic surface; and
    etching the semiconductor surface using the photoresist layer that is patterned to provide the semiconductor device.

2. The method of claim 1, wherein said patterning is a lithography method using EUV lithography.

3. The method of claim 1, wherein said patterning is a lithography method using E-beam lithography.

4. The method of claim 1, wherein the semiconductor surface is comprised of a type IV semiconductor material.

5. The method of claim 1, wherein the semiconductor surface comprises amorphous silicon.

6. The method of claim 1, wherein said vapor priming agent bearing chemical functionality based on alkynes to convert the terminated surface to a hydrophobic organic surface comprises an alkyne selected from the group consisting of 5-chloro-1-pentyne, Propargyl ether, Iodo-1-pentyne, 5-Hexynoic acid, 1,7-Octadiyne, Ethyl propiolate, Dimethyl propargylmalonate, Methyl propiolate, 1-Hexyne, 1-Octyne, and combinations thereof.

7. The method of claim 1, wherein the forming the photoresist layer comprises spin on deposition.

8. The method of claim 1, wherein the developing patterned portions of the photoresist comprises TMAH.

9. The method of claim 1, wherein the semiconductor device is a field effect transistor.

10. A method of forming a semiconductor device comprising:
    removing an oxide containing surface layer from a semiconductor surface that is to be patterned with a fluoride based chemistry, wherein applying the fluoride based chemistry to the surface to be patterned forms a terminated surface;
    applying a priming agent bearing chemical functionality based on alcohols to convert the terminated surface to a hydrophobic organic surface;
    patterning a photoresist layer on the hydrophobic organic surface; and
    etching the semiconductor surface using the photoresist layer that is patterned to provide the semiconductor device.

11. The method of claim 10, wherein said patterning is a lithography method using EUV lithography.

12. The method of claim 10, wherein said patterning is a lithography method using E-beam lithography.

13. The method of claim 10, wherein the semiconductor surface is comprised of a type IV semiconductor material.

14. The method of claim 13, wherein the semiconductor surface is comprised of silicon.

15. The method of claim 10, wherein the semiconductor surface comprises amorphous silicon.

16. The method of claim 10, wherein said vapor priming agent bearing chemical functionality based on alkynes to convert the terminated surface to a hydrophobic organic surface comprises an alcohol selected from the group consisting of 2-Propyn-1-ol, 3-Butyn-1-ol, 4-Pentyn-1-ol, 1-Hexyn-3-ol, 4-Pentyn-2-ol, 1-Pentyn-3-ol, 4-Methyl-1-heptyn-3-ol, 5-Hexyn-3-ol, 1-Octyn-3-ol, 3-Butyn-2-ol, 3,5-Dimethyl-1-hexyn-3-ol, 2-Methyl-3-butyn-2-ol, 3-Methyl-1-pentyn-3-ol, 3-Ethyl-1-pentyn-3-ol, 1-Ethynylcyclopentanol and combinations thereof.

17. The method of claim 10, wherein the forming the photoresist layer comprises spin on deposition.

18. The method of claim 10, wherein the developing patterned portions of the photoresist comprises TMAH.

19. The method of claim 10, wherein the semiconductor device is a field effect transistor.

20. The method of claim 10, wherein the etching the semiconductor surface comprises an anisotropic etch.

* * * * *